(12) United States Patent
Bhattacharya et al.

(10) Patent No.: US 10,001,531 B2
(45) Date of Patent: Jun. 19, 2018

(54) GIANT MAGNETO-IMPEDANCE (GMI) BASED SENSING DEVICE FOR THE DETECTION OF CARBURIZATION IN AUSTENITIC STAINLESS STEEL

(71) Applicants: Indian Oil Corporation Limited, Bandra (East), Mumbai (IN); Council of Scientific and Industrial Research, Rafi Marg, New Delhi (IN)

(72) Inventors: Sova Bhattacharya, Faridabad (IN); Qazi Mohammad Amir, Faridabad (IN); Chandrasekaran Kannan, Faridabad (IN); Brijesh Kumar, Faridabad (IN); Biswapriya Das, Faridabad (IN); Ashish Kumar Panda, Jamshedpur (IN); Rajat Kumar Roy, Jamshedpur (IN); Tarun Kumar Das, Jamshedpur (IN); Swapan Kumar Das, Jamshedpur (IN); Amitava Mitra, Jamshedpur (IN)

(73) Assignees: Indian Oil Corporation Limited, Bandra (East) (IN); COUNCIL OF SCIENTIFIC & INDUSTRIAL RESEARCH, New Delhi (IN)

( * ) Notice: Subject to any disclaimer, the term of this patent is extended or adjusted under 35 U.S.C. 154(b) by 41 days.

(21) Appl. No.: 15/202,184

(22) Filed: Jul. 5, 2016

(65) Prior Publication Data
US 2017/0131369 A1    May 11, 2017

(30) Foreign Application Priority Data
Jul. 15, 2015    (IN) .......................... 2679/MUM/2015

(51) Int. Cl.
*G01R 33/09*    (2006.01)
*B82Y 30/00*    (2011.01)
(Continued)

(52) U.S. Cl.
CPC .......... *G01R 33/093* (2013.01); *C22C 19/007* (2013.01); *C22C 19/07* (2013.01)

(58) Field of Classification Search
CPC .................................................... G01R 33/09
(Continued)

(56) References Cited

U.S. PATENT DOCUMENTS 6,239,594 B1 * 5/2001 Naito et al. ................... 324/249
7,405,559 B1 * 7/2008 Hagerty ....................... 324/249
(Continued)

FOREIGN PATENT DOCUMENTS

EP    0049951          4/1982
ES    2219159 A1 *    11/2004
GB    1517096          7/1978

OTHER PUBLICATIONS

European Search Opinion, dated Dec. 16, 2016.*
(Continued)

*Primary Examiner* — Bot Ledynh
(74) *Attorney, Agent, or Firm* — Workman Nydegger

(57) ABSTRACT

The present invention relates to a compound exhibiting Giant Magneto-Impedance (GMI) properties. The general chemical formula of the compound is $(Fe_xCo_{100-x})_{100-(\alpha+\beta+\gamma)}Cr_\alpha Si_\beta B_\gamma$, characterized in that $\alpha<\beta$ and $\alpha<\gamma$, wherein $\alpha$ is preferably in the range of 2 to 4% by weight, $\beta$ is preferably in the range of 11.5% to 13% by weight, and $\gamma$ is preferably in the range of 11% to 13% by weight, and X is preferably about 6% by weight. The chemical formula more preferably is $(Fe_{6\%}Co_{94\%})_{72.5\%}Cr_{2\%}Si_{12.5\%}B_{13\%}$. The present invention also relates to a giant magneto-impedance (GMI) based sensing device for non-destructive contactless detection of carburization in austenitic stainless steel samples in field.

11 Claims, 6 Drawing Sheets

Working principle and data flow during test of a carburized steel detection of carburization in SS321 plate using a computer controlled Giant magneto-impedance device

(51) Int. Cl.
  *B82Y 10/00* (2011.01)
  *C22C 19/07* (2006.01)
  *C22C 19/00* (2006.01)

(58) Field of Classification Search
  USPC .................. 324/252; 977/810, 811, 838, 849
  See application file for complete search history.

(56) References Cited

U.S. PATENT DOCUMENTS

| | | | |
|---|---|---|---|
| 7,542,235 B2* | 6/2009 | Kuboki | 360/135 |
| 2007/0090889 A1* | 4/2007 | Nomura | 331/167 |
| 2013/0141081 A1* | 6/2013 | Pfaffinger et al. | 324/207.12 |
| 2014/0277017 A1* | 9/2014 | Leimbach et al. | 606/167 |

OTHER PUBLICATIONS

Miyar et al., Giant Magneoimpedance of Electrochemically Surface Modified Co-Based Amorphous Ribbons, Nov. 2008.*
Granovsky et al., Transport Phenomena in Fe—Co—Si—B Amorphous Ferromagnetic alloys, Jan. 1996.*
Tamag, Translation of ES2219159A1, Nov. 2004.*

* cited by examiner

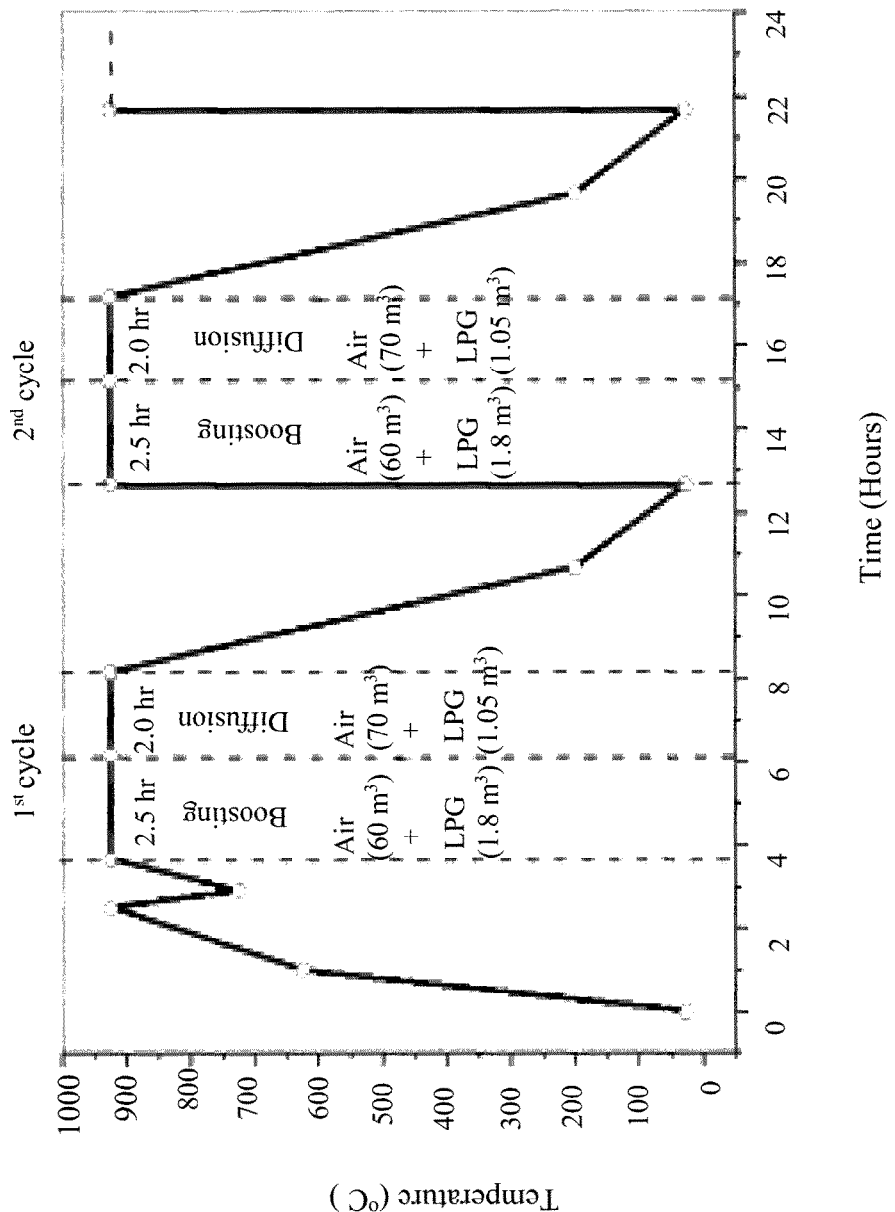
Fig-1: The boosting and diffusion cycle followed for the supplied SS321 plate

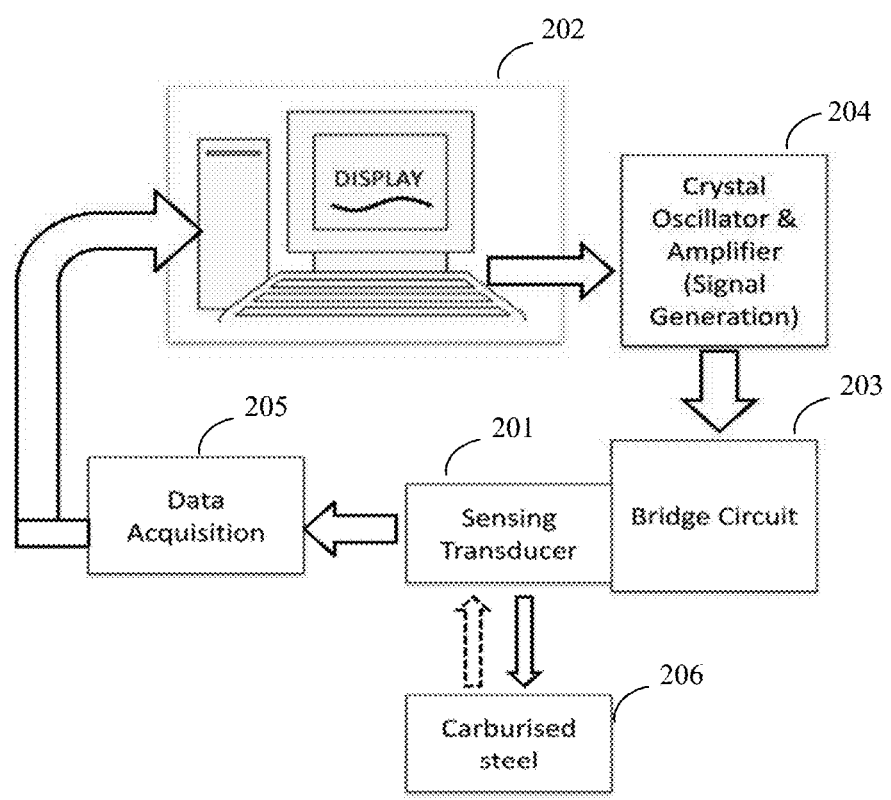
Fig-2: Working principle and data flow during test of a carburized steel

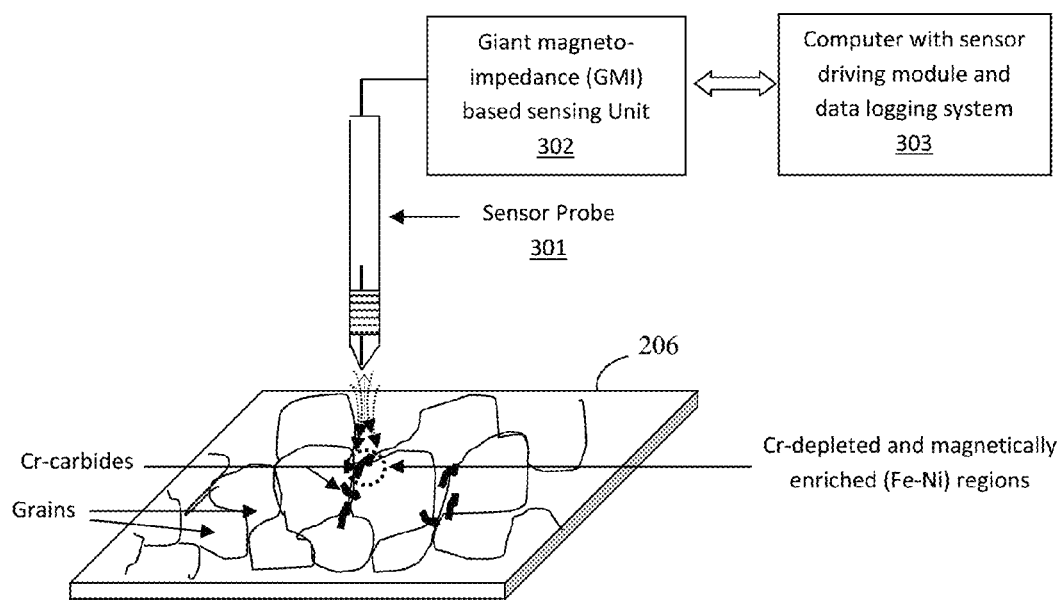
Fig-3: detection of carburization in SS321 plate using a computer controlled Giant magneto-impedance device

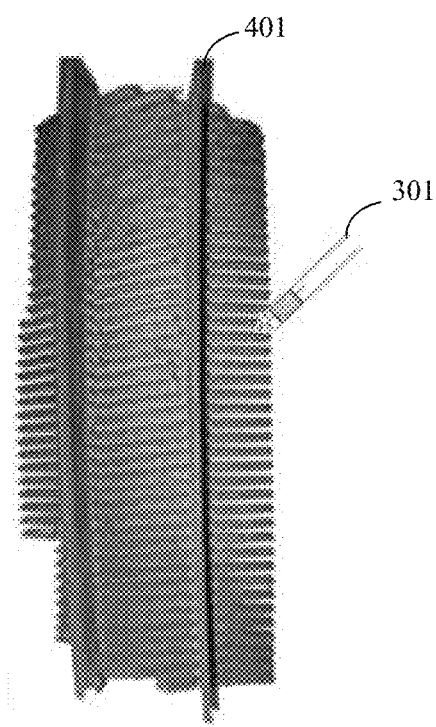
Fig-4: Practical use of sensor in testing of a failed Screen Sample

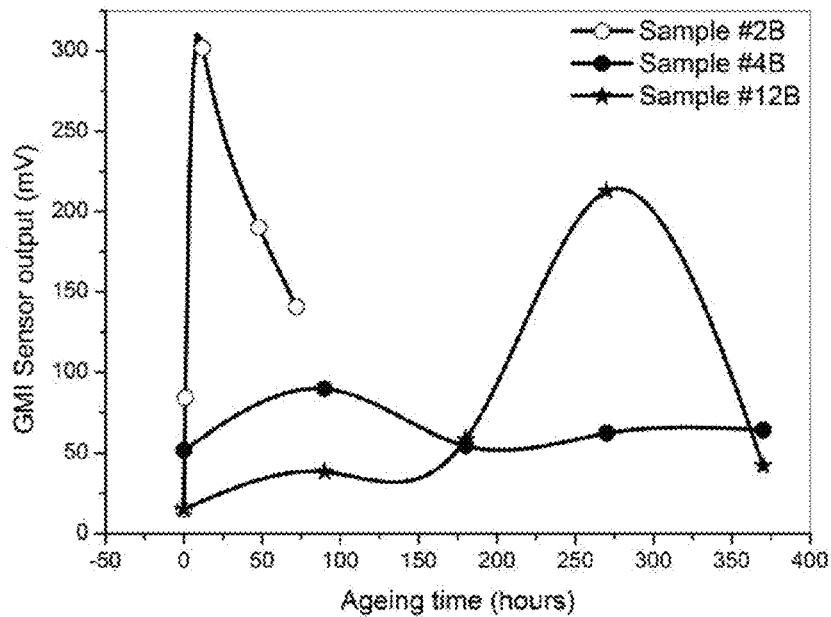
Fig-5: Giant magneto-impedance sensor output for the 321SS plate carburized for different cycles and aged for different durations at 800°C (#2B, #4B) and 780°C (#12B)
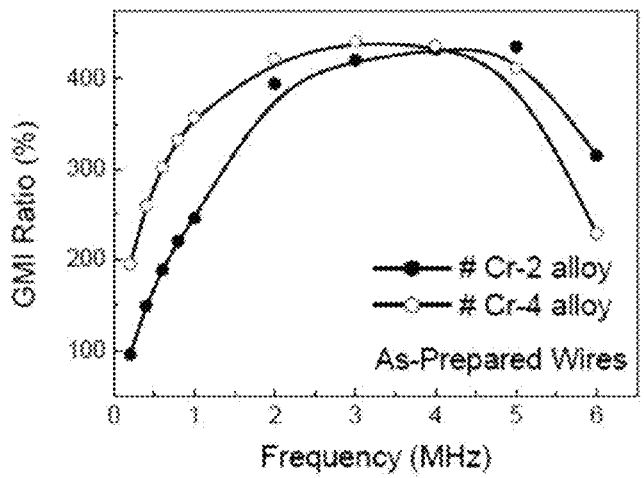
Fig-6: Variation of GMI $_{max}$ with frequency for as-spun wires

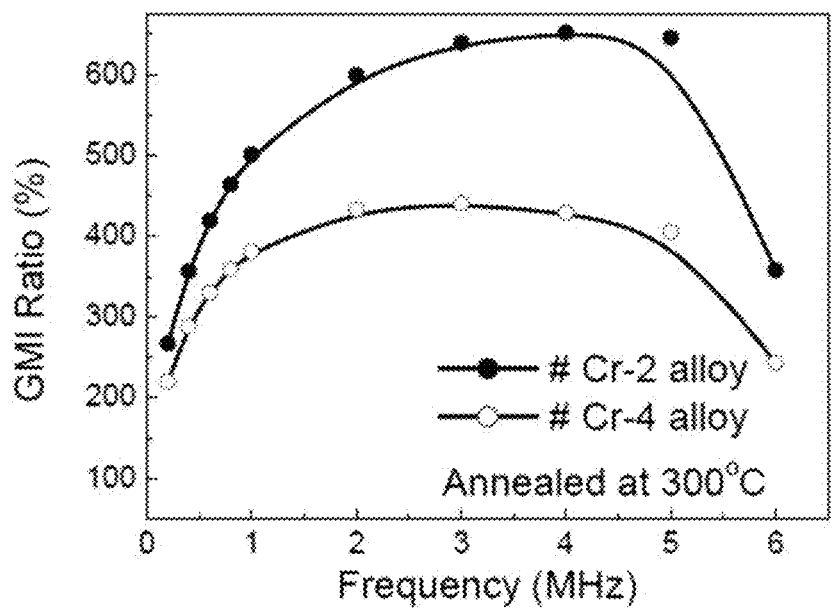
Fig-7: Variation of $GMI_{max}$ with frequency for wires annealed at 300°C

GIANT MAGNETO-IMPEDANCE (GMI) BASED SENSING DEVICE FOR THE DETECTION OF CARBURIZATION IN AUSTENITIC STAINLESS STEEL

FIELD OF THE INVENTION

The present invention relates to a composition exhibiting Giant Magneto-Impedance (GMI) properties. The present invention also relates to a giant magneto-impedance (GMI) based sensing device for detection of carburization in austenitic stainless steel.

BACKGROUND OF THE INVENTION

Damage assessment of structural components used in industries like power, petrochemical, steel etc. is required for prevention of premature failure. Carburization is one of the causes for the failure of steel components in petrochemical industries. Carburization occurs at elevated temperature in the presence of carbon rich gases. Associated phenomenon such as metal dusting, microstructure alteration and brittleness reduce the service life of the industrial components. Thus, evaluation and monitoring of carburization is necessary to avoid catastrophic failure of components. The process of high temperature carburization involves the steps of formation of carbon layer on the surface, inward diffusion of dissolved carbon into the metal, reaction of carbon with carbide forming elements to form carbides of the type $Cr_{23}C_6$ and $C_7C_3$. The carbides and the austenitic steel are paramagnetic in nature. However, the formation of these chromium carbides leads to depletion of chromium in the matrix. Consequently there is enrichment of Fe and Ni in the matrix and the material becomes ferromagnetic in nature. PZT-based sensors are widely used to determine the flaws in structural components. Inductive sensors using ferrite cores are also extensively used for nondestructive testing (NDT). Magnetic sensors with high sensitivity have been investigated for some years to improve the performances of sensing device. Anisotropic magneto-resistance (AMR), giant magneto-resistance (GMR), fluxgate and SQUID sensors have been explored not only for the flaw identification but also evaluation of damages that occur prior to the formation of cracks. Attempts have been made to develop sensing devices using GMI materials.

Austenitic stainless steel have high amount of chromium (16 to 20%) and nickel (8 to 10%). Due to high nickel and chromium content the steel remains in austenitic phase even in the room temperature. Hence the material exhibits paramagnetic property. Carburization results in the formation of chromium carbides in the austenitic stainless steel. Chromium carbides are formed because chromium has more affinity to form Carbides than nickel and iron which are present in the material. The carbides generally formed are $Cr_{23}C_6$ and $Cr_7C_3$. Due to the formation of these carbides small chromium depleted areas is formed near to carbide sites. These chromium depleted areas will have high relative concentration of iron and nickel. Due to the increase in the concentration of iron and nickel these areas will transform from paramagnetic to ferromagnetic state.

GB 1517096 discloses a device for monitoring carburization by measuring permeability in which the energizing coil is excited at a certain frequency and the e.m.f induced in detecting coil coupled to the energizing coil is measured. The method is not suitable as the ferromagnetic oxides formed in outer surface of tubes also influence the measurement. EP 81304158.9 discloses measurement of carburization in furnace tubes using the method of differential permeability technique. However, such technique has limitation owing to frequency selection criteria to meet the desired penetration depths.

Ferromagnetic behavior of stainless steel due to carburization is studied by various authors. In these studies, the level of carburization of the samples was determined by nondestructive magnetic flux density measurements before they were removed from the tubes. This technique measures the magnetic flux density near the external surface of the tubes by means of a magnetoresistive sensor biased by a small ferrite magnet.

SUMMARY OF INVENTION

This summary is provided to introduce a selection of concepts in a simplified form that are further described below in the detailed description. This summary is not intended to identify key features or essential features of the claimed subject matter, nor is it intended as an aid in determining the scope of the claimed subject matter.

According to one aspect of the invention, a compound of following chemical formula is provided: $(Fe_X Co_{100-X})_{100-(\alpha+\beta+\gamma)}Cr_\alpha Si_\beta B_\gamma$, characterized in that $\alpha<\beta$ and $\alpha<\gamma$, wherein $\alpha$ may preferably be in the range of 2 to 4% by weight, $\beta$ may preferably be in the range of 11.5% to 13% by weight, $\gamma$ may preferably be in the range of 11% to 13% by weight. Further, $\gamma$ may preferably be about $(15-\alpha)\%$ by weight and X may preferably be about 6% by weight. More preferably, the chemical formula is $(Fe_{6\%}Co_{94\%})_{72.5\%}Cr_{2\%}Si_{12.5\%}B_{13\%}$.

According to another aspect of the invention, a nanostructured wire is provided, which is made of a compound of chemical formula $(Fe_X Co_{100-X})_{100-(\alpha+\beta+\gamma)}Cr_\alpha Si_\beta B_\gamma$, characterized in that $\alpha<\beta$ and $\alpha<\gamma$. The compound comprises about 72.5% Iron Cobalt alloy (FeCo), about 2% Chromium (Cr), about 12.5% Silicon (Si), and about 13% Boron (B). Further, the Iron Cobalt alloy comprises about 6% Iron (Fe) and about 94% Cobalt (Co). The diameter of the nanostructured wire may be in a range of 90 to 110 µm.

According to another aspect of the invention, a giant magneto-impedance (GMI) based sensing device is provided for detection of carburisation in austenitic stainless. The device comprises: a hand-held sensor probe having a nanostructured wire as a sensing transducer, the nanostructured wire comprising a compound of chemical formula $(Fe_X Co_{100-X})_{100-(\alpha+\beta+\gamma)}Cr_\alpha Si_\beta B_\gamma$, characterized in that $\alpha<\beta$ and $\alpha<\gamma$. One end of the hand-held sensor probe may be pointed in shape. The device can operate in a frequency of 200 K Hz to 1.5 M Hz. The diameter of the nanostructured wire is about 100 µm±10%. The device further comprises: a crystal oscillator and an amplifier for providing control signals to the sensing transducer through a bridge circuit, a digital display to show output of the device and waveforms thereof, and an interface to communicate with a data acquisition and/or control system.

The advantages of the present invention include, but are not limited to that the compound and the nanostructured wires made thereof exhibit superior Giant magneto-impedance properties that in one example can be utilized for detecting carburization in austenitic stainless steel samples, even having irregular surfaces. The device allows nondestructive contactless on-site testing of such samples. The device also allows contact based testing of the sample without penetration. The device is hand-held and light weight, and hence portable.

The details of one or more embodiments are set forth in the accompanying drawings and description below. Other features and advantages will be apparent from a reading of the following detailed description and a review of the associated drawings. It is to be understood that the following detailed description is explanatory only and is not restrictive of the invention as claimed.

BRIEF DESCRIPTION OF DRAWINGS

To further clarify the advantages and features of the invention, a more particular description of the invention will be rendered by reference to specific embodiments thereof, which is illustrated in the appended drawings. It is appreciated that these drawings depict only typical embodiments of the invention and are therefore not to be considered limiting of its scope. The invention will be described and explained with additional specificity and detail with the accompanying drawings in which:

FIG. 1 illustrates an exemplary graph pertaining to boosting and diffusion cycle followed for the supplied SS321.

FIG. 2 illustrates an exemplary scheme of working principle and data flow during test of a carburized steel specimen.

FIG. 3 illustrates an exemplary schematic presentation of detection of carburization in SS321 plate using a computer controlled Giant magneto-impedance device.

FIG. 4 illustrates an exemplary practical use of the Giant magneto-impedance device.

FIG. 5 illustrates an exemplary Giant magneto-impedance sensor output for the 321SS plate carburized for different cycles and aged for different durations at 800° C. (#2B, #4B) and 780° C. (#12B).

FIG. 6 illustrates an exemplary chart for variation of $GMI_{max}$ with frequency for as-spun wires.

FIG. 7 illustrates an exemplary chart for variation of $GMI_{max}$ with frequency for wires annealed at 300° C.

It may be noted that to the extent possible, like reference numerals have been used to represent like elements in the drawings. Further, those of ordinary skill in the art will appreciate that elements in the drawings are illustrated for simplicity and may not have been necessarily drawn to scale. For example, the dimensions of some of the elements in the drawings may be exaggerated relative to other elements to help to improve understanding of aspects of the invention. Furthermore, the one or more elements may have been represented in the drawings by conventional symbols, and the drawings may show only those specific details that are pertinent to understanding the embodiments of the invention so as not to obscure the drawings with details that will be readily apparent to those of ordinary skill in the art having the benefits of the description herein.

DESCRIPTION OF THE INVENTION

For the purpose of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated system, and such further applications of the principles of the invention as illustrated therein being contemplated as would normally occur to one skilled in the art to which the invention relates.

It will be understood by those skilled in the art that the foregoing general description and the following detailed description are exemplary and explanatory of the invention and are not intended to be restrictive thereof. Throughout the patent specification, a convention employed is that in the appended drawings, like numerals denote like components.

Reference throughout this specification to "an embodiment", "another embodiment" or similar language means that a particular feature, structure, or characteristic described in connection with the embodiment is included in at least one embodiment of the invention. Thus, the appearances of the phrase "in an embodiment", "in another embodiment" and similar language throughout this specification may, but do not necessarily, all refer to the same embodiment.

The terms "comprises", "comprising", or any other variations thereof, are intended to cover a non-exclusive inclusion, such that a process or method that comprises a list of steps does not include only those steps but may include other steps not expressly listed or inherent to such process or method. Similarly, one or more devices or sub-systems or elements or structures proceeded by "comprises . . . a" does not, without more constraints, preclude the existence of other devices or other sub-systems.

Various embodiments of the invention will be described below in detail with reference to the accompanying drawings.

The present invention discloses composition exhibiting Giant Magneto-Impedance (GMI) properties. Further, the present invention also discloses a device for detecting carburization in austenitic steel. Particularly, the present invention discloses a Giant magneto-impedance (GMI) based sensor for detection of carburization in austenitic steel. The present invention also discloses a method for detection of carburization in austenitic stainless steel using a GMI based sensing device.

In the Fe—Cr—Ni alloy system, the austenitic stainless steel lies in the paramagnetic state. The change in the concentration of chromium, nickel and iron, changes the austenitic stainless steel to ferromagnetic steel. The SS321 plate during carburization transforms from paramagnetic state to ferromagnetic state. For this, transformation, the steel has been subjected to different durations (boosting) of carburization, diffusion (FIG. 1) and subsequent heat treatment at different temperatures and ageing times to induce variations in carburization so that such para-ferro transformation occurs. The regions with Cr-carbide precipitates formed during carburization have depleted Cr content. As a result the adjoining areas become ferromagnetic domains rich in FeNi content.

In an aspect of the present invention, a composition exhibiting GMI properties is disclosed, such composition comprising:
 a. 72.5% Cobalt-Iron alloy, said Cobalt Iron alloy having 94% Cobalt (Co) and 6% Iron (Fe);
 b. 12.5% Silicon (Si);
 c. 13% Boron (B); and
 d. 2% Chromium (Cr).

In accordance with the present invention, a device for detecting carburization in austenitic steel is disclosed, such device comprising of a hand-held probe, wherein a nanostructured rapidly solidified wire of a GMI material as a sensing transducer, and wherein the GMI material comprises a nominal composition of $(Co_{94\%}Fe_{6\%})_{72.5\%}Si_{12.5\%}B_{13\%}Cr_{2\%}$. In an embodiment, diameter of the wire is in a range of 90 to 110 μm. In another embodiment, the device operates in a frequency of 200 K Hz to 1.5 M Hz.

In accordance with the present invention, the device further comprises a crystal oscillator and amplifier for providing control signals to the sensing transducer through a bridge circuit. In another embodiment, the device comprises a digital display to show output of the device and waveforms. The device further comprises an interface to communicate with a data acquisition and/or control system.

Having described the basic aspects of the present invention, the following non-limiting examples illustrate specific embodiment thereof.

The present invention provides a Giant Magneto-Impedance (GMI) based magnetic sensing device for detection of carburization in SS321 in non-invasive way. The SS321 plate during carburization transforms from paramagnetic state to ferromagnetic state. For this, transformation, the steel has been subjected to different durations (boosting) of carburization, diffusion (FIG. 1) and subsequent heat treatment at different temperatures and ageing times to induce variations in carburization so that such para-ferro transformation occurs. The GMI based sensing device comprises of a computer controlled system with display of the sensor signal. The GMI based sensing transducer 201 can be triggered on using an external programmable system and simultaneously the data can be displayed on a computing device 202 (FIG. 2). As shown, the sensing transducer 201 is coupled with a bridge circuit 203. The bridge circuit 203 is communicatively coupled with a crystal oscillator and amplifier 204 that generates a sufficiently large electrical signal even for small values of carburization. All the sensed data is sent to the data acquisition system 205 that can be shared with the computing device 202 for display and further analysis. The sensor transducer 201 includes a sensor probe 301, which can be placed in contact mode or at close proximity (2-3 mm) above the carburized steel sample 206 (FIG. 3). The regions with Cr-carbide precipitates formed during carburization have depleted Cr content. As a result the adjoining areas become ferromagnetic domains rich in FeNi content. Consequently, the emanated flux from these ferromagnetic regions is picked up by the sensor probe 301. The emanated and subsequently received flux is converted to secondary voltage by the GMI sensor unit 302 and displayed in the form of a waveform with a corresponding display of the peak or rms voltage quantitatively on the computer 303 having sensor driving module and data logging system.

FIG. 4 illustrates an exemplary practical use of the device as per the present invention. The device uses a compound exhibiting Giant Magneto Impedance (GMI) properties as the basic sensing element for detection of carburization in 321SS austenitic stainless steel. The sensing element is prepared from a rapidly solidified nanostructured wires of said compound having Giant Magneto Impedance properties. In-water quenching system may be used for preparation of rapidly quenched cast wire. During tests, the 321 SS plate has been carburized and aged at various temperatures (750° C., 800° C.) for different durations for the formation of carbides. The material which was initially non-magnetic in nature became ferromagnetic on carburisation. The GMI based sensing device showed increase in output voltage with increase in carburisation duration. The developed device also indicated the change in amplitude of the real time waveform when the probe is placed in different carburised test pieces. As shown, the sensor probe which is pointed in shape at one end can be used to check carburization in the 321 SS plate having irregular surface 401, such as Johnson screen. Due to this pointed shape and non-contact non-penetration sensing ability, the sensor probe 301 can be used on difficult surfaces in the field thanks to portability and light weight of the device. That is really advantageous over state of the art techniques as they utilize destructive testing, i.e., the sample has to be destructed in order to detect carburization. On the other hand, the present invention allows non-destructive testing even on difficult surfaces in the field.

Example-1

The response of Giant magneto-impedance (GMI) based sensing device was observed on carburized samples which have been initially generated through a boosting cycle of 2½ hours and diffusion cycle for 2 hours at a temperature of 925° C. The samples mentioned in this example have been subjected to twice (designate Sample #2B) of such combined cycles (boosting+diffusion) of 4½ hours leading to a total exposure time of 9 hours. For further enhancement of diffusion, controlled heat treat schedule was followed for 1 hours at different temperatures ranging from 700° C. to 900° C. displayed in table-I. The GMI based sensing device showed an increasing output voltage from 20 mV to a maximum value of 84 mV with the increase in heat treatment temperature also signifying enhancement of ferromagnetism in the material with the increase in carburization.

TABLE 1

Sample #2B

| Sl. No | Heat treatment Duration (hrs) | Heat treatment temperature (° C.) | GMI voltage (mV) |
| --- | --- | --- | --- |
| 1. | 1 hour | 700 | 20 |
| 2. | | 750 | 20 |
| 3. | | 800 | 84 |
| 4. | | 850 | 56 |
| 5. | | 900 | 37 |

Example-2

The response of Giant magneto-impedance (GMI) based sensing device was observed on carburized samples which have been subjected to different heat treatment duration at a constant temperature. A set of samples mentioned in Example-1 subjected to twice (designate Sample #2B) of combined cycles (boosting+diffusion) of 4½ hours leading to a total exposure time of 9 hours was used. For further enhancement of diffusion, controlled heat treat schedule was followed for different hours at a constant temperature of 750° C. displayed in Table-2. The GMI based sensing device showed an increasing output voltage from 15 mV to a maximum value of 233 mV with the increase in heat treatment duration also signifying enhancement of ferromagnetism in the material with the increase in carburization.

TABLE 2

Sample #2B

| Sl. No | Heat treatment temperature (° C.) | Heat treatment Duration (hours) | GMI voltage (mV) |
| --- | --- | --- | --- |
| 1. | As-carburized | | 15 |
| 2. | 750° C. | 1 | 20 |
| 3. | | 24 | 230 |
| 4. | | 48 | 233 |
| 5. | | 70 | 225 |

Example-3

The response of Giant magneto-impedance (GMI) based sensing device was observed on carburized samples which have been subjected to different heat treatment duration at a constant temperature. A set of samples mentioned in Example-1 subjected to twice (designate Sample #2B) of combined cycles (boosting+diffusion) of 4½ hours leading to a total exposure time of 9 hours was used. For further enhancement of diffusion, controlled heat treat schedule was followed for different hours at a constant temperature of 800° C. displayed in table-3. The GMI based sensing device showed an increasing output voltage from 15 mV to a maximum value of 302 mV (FIG. 5) with the increase in heat treatment duration also signifying enhancement of ferromagnetism in the material with the increase in carburization.

TABLE 3

Sample #2B

| Sl. No | Heat treatment temperature (° C.) | Heat treatment Duration (hours) | GMI voltage (mV) |
|---|---|---|---|
| 1. | As-carburized | | 15 |
| 2. | 800° C. | 1 | 84 |
| 3. | | 12 | 302 |
| 4. | | 48 | 190 |
| 5. | | 72 | 141 |

Example-4

The response of Giant magneto-impedance (GMI) based sensing device was observed on carburized samples which have been subjected to different heat treatment duration at a constant temperature. A set of samples mentioned in Example-1 subjected to four times (designate Sample #4B) of combined cycles (boosting+diffusion) of 4½ hours leading to a total exposure time of 18 hours was used. For further enhancement of diffusion, controlled heat treat schedule was followed for different hours at a constant temperature of 800° C. displayed in table-4. The GMI based sensing device showed an increasing output voltage from 52 mV to a maximum value of 90 mV (FIG. 5) with the increase in heat treatment duration also signifying enhancement of ferromagnetism in the material with the increase in carburization.

TABLE 4

Sample #4B

| Sl. No | Heat treatment temperature (° C.) | Heat treatment Duration (hours) | GMI voltage (mV) |
|---|---|---|---|
| 1. | As-carburized | | 52 |
| 2. | 800 ° C. | 90 | 90 |
| 4. | | 270 | 62 |
| 5. | | 370 | 64 |

Example-5

The response of Giant magneto-impedance (GMI) based sensing device was observed on carburized samples which have been subjected to different heat treatment duration at a constant temperature. A set of samples mentioned in Example-1 subjected to twelve times (designate Sample #12B) of combined cycles (boosting+diffusion) of 4½ hours leading to a total exposure time of 54 hours was used. For further enhancement of diffusion, controlled heat treat schedule was followed for different hours at a constant temperature of 800° C. displayed in table-5. The GMI based sensing device showed an increasing output voltage from 15 mV to a maximum value 213 mV (FIG. 5) with the increase in heat treatment duration also signifying enhancement of ferromagnetism in the material with the increase in carburization.

TABLE 5

Sample #12B

| Sl. No | Heat treatment temperature (° C.) | Heat treatment Duration (hours) | GMI voltage (mV) |
|---|---|---|---|
| 1. | As-carburized | | 15 |
| 2. | 800° C. | 90 | 38 |
| 4. | | 180 | 58 |
| 5. | | 270 | 213 |
| 6. | | 370 | 42 |

The sensing device utilizes the Giant magneto-impedance property of rapidly quenched materials obtained in the form of nanostructured wires with a typical diameter of about 100 micrometer. The Giant magneto-impedance (GMI) based sensing device with the nanostructured wire as the core material, exhibits lowest field sensitivity of about 300 mOe. The quenching apparatus, such as a wire caster may be used to prepare said nanostructured wires, wherein the molten metal of suitable composition is quenched by rapidly rotating water stream. The parameters, such as ejection pressure, nozzle diameter, superheat temperature can be adjusted in such a way that the wire diameter is around 100 μm±10. Table 6 given below lists the as cast properties of two prepared samples obtained at driving frequency 1 MHz and 2 mA driving current.

TABLE 6

| | Peak value of GMI Ratio, $GMI_{max}$ (%) at 1 MHz frequency | |
|---|---|---|
| Sample Composition | As-prepared | Annealed at 300° C. for 30 min |
| $(Co_{94}Fe_6)_{72.5}Si_{12.5}B_{13}Cr_2$ | 246 | 500 |
| $(Co_{94}Fe_6)_{72.5}Si_{12.5}B_{11}Cr_4$ | 357 | 375 |

Frequency variation of the peak value of GMI signal, $GMI_{max}$ for as cast materials is shown in FIG. 6. This shows that the materials will be suitable for working in the frequency range of 500 kHz to 5 MHz. Above that frequency range the materials property deteriorate. To enhance the property further, the developed wires were annealed at different temperatures for 10 minutes. The variation of the peak value of GMI signal, $GMI_{max}$ measured at 1 MHz and 2 mA current for annealed wires (annealed at 300° C.) of both the alloys is shown in FIG. 7. It clearly shows that the $(Co_{94}Fe_6)_{72.5}Si_{12.5}B_{13}Cr_2$ alloy exhibited superior properties after annealing at 300° C. Thus the material in the form of wire of diameter 100 μm±10 μm and having composition $(Co_{94}Fe_6)_{72.5}Si_{12.5}B_{13}Cr_2$ (at %) was used for the proposed sensing device to monitor carburization in SS321.

Embodiments of the invention have been described in detail for purposes of clarity and understanding. However, it will be appreciated that certain changes and modifications may be practiced within the scope of the appended claims. Thus, although the invention is described with reference to specific embodiments and figures thereof, the embodiments and figures are merely illustrative, and not limiting of the invention. Rather, the scope of the invention is to be determined solely by the appended claims.

We claim:

1. An alloy of chemical formula: $(Fe_{6\%}Co_{94\%})_{72.5\%}Cr_{2\%}Si_{12.5\%}B_{13\%}$.

2. A nanostructured wire comprising: about 72.5% Iron Cobalt alloy (FeCo), about 2% Chromium (Cr), about 12.5% Silicon (Si), and about 13% Boron (B).

3. The nanostructured wire as claimed in claim 2, wherein the Iron Cobalt alloy comprises about 6% Iron (Fe) and about 94% Cobalt (Co).

4. The nanostructured wire as claimed in claim 2, wherein diameter of the nanostructured wire is in a range of 90 to 110 μm.

5. A giant magneto-impedance (GMI) based sensing device for detection of carburisation in austenitic stainless, the device comprising: a hand-held sensor probe having a nanostructured wire inside a detecting coil acting as a sensing transducer, wherein the nanostructured wire comprising a compound of chemical formula $(Fe_{6\%}Co_{94\%})_{72.5\%}Cr_{2\%}Si_{12.5\%}B_{13\%}$.

6. The device as claimed in claim 5, wherein one end of the hand-held sensor probe is pointed in shape.

7. The device as claimed in claim 5, wherein the device operates in a frequency of 200 kHz to 1.5 MHz.

8. The device as claimed in claim 5, wherein diameter of the nanostructured wire is about 100 μm±10%.

9. The device as claimed in claim 5 further comprising: a crystal oscillator and an amplifier for providing control signals to the sensing transducer through a bridge circuit.

10. The device as claimed in claim 5 further comprising: a digital display to show output of the device and waveforms thereof.

11. The device as claimed in claim 5 further comprising: an interface to communicate with a data acquisition and/or control system.

* * * * *